United States Patent
Yu et al.

(10) Patent No.: US 11,562,932 B2
(45) Date of Patent: Jan. 24, 2023

(54) METHOD TO IMPROVE CMOS DEVICE PERFORMANCE

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Guobin Yu, Shanghai (CN); Xiaoping Xu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 628 days.

(21) Appl. No.: 15/926,759

(22) Filed: Mar. 20, 2018

(65) Prior Publication Data

US 2018/0277441 A1 Sep. 27, 2018

(30) Foreign Application Priority Data

Mar. 22, 2017 (CN) .......................... 201710171545.2

(51) Int. Cl.
*H01L 21/8234* (2006.01)
*H01L 27/088* (2006.01)
(Continued)

(52) U.S. Cl.
CPC .... *H01L 21/823462* (2013.01); *H01L 21/022* (2013.01); *H01L 21/02233* (2013.01);
(Continued)

(58) Field of Classification Search
CPC ........... H01L 21/823462; H01L 21/022; H01L 21/02233; H01L 21/02255;
(Continued)

(56) References Cited

U.S. PATENT DOCUMENTS 5,817,549 A * 10/1998 Yamazaki ......... H01L 21/02337
438/166
5,926,741 A * 7/1999 Matsuoka ........... H01L 21/0214
438/778
(Continued)

FOREIGN PATENT DOCUMENTS

| CN | 1675759 | 9/2005 |
| CN | 1937208 | * 3/2007 |

(Continued)

OTHER PUBLICATIONS

Chinese Application No. 201710171545.2, Office Action dated May 8, 2020, 7 pages.

*Primary Examiner* — Thanhha S Pham
(74) *Attorney, Agent, or Firm* — Anova Law Group, PLLC

(57) ABSTRACT

A method for manufacturing a semiconductor device includes providing a substrate including a first device region and a second device region spaced apart from each other, forming a first oxide layer on the first device region and the second device region, forming a second oxide layer below the first oxide layer, forming a mask layer on the first oxide layer on the first device region while exposing the first oxide layer on the second device region, removing the first and second oxide layers on the second device region using the mask layer as a mask, removing the mask layer, and forming a gate oxide layer on the second device region. The thus formed gate oxide layer structure has improved quality and reliability.

11 Claims, 7 Drawing Sheets

(51) Int. Cl.
  *H01L 21/311* (2006.01)
  *H01L 21/02* (2006.01)
(52) U.S. Cl.
  CPC .. *H01L 21/02255* (2013.01); *H01L 21/31144* (2013.01); *H01L 27/088* (2013.01)
(58) Field of Classification Search
  CPC ............. H01L 21/31144; H01L 27/088; H01L 21/8238; H01L 21/823857; H01L 51/0516; H01L 51/0529; H01L 27/11246; H01L 27/1237
  USPC ...................................................... 257/288
  See application file for complete search history.

(56) References Cited

U.S. PATENT DOCUMENTS

| | | | | |
|---|---|---|---|---|
| 6,080,682 | A * | 6/2000 | Ibok | H01L 21/32 257/E21.258 |
| 6,110,842 | A * | 8/2000 | Okuno | H01L 21/28185 257/E21.625 |
| 6,124,171 | A * | 9/2000 | Arghavani | H01L 21/823462 257/E21.625 |
| 6,756,635 | B2 * | 6/2004 | Yasuda | H01L 21/28176 257/325 |
| 6,759,302 | B1 * | 7/2004 | Chen | H01L 21/28202 438/275 |
| 6,797,323 | B1 * | 9/2004 | Kashiwagi | H01L 21/02238 257/E21.285 |
| 6,946,349 | B1 * | 9/2005 | Lee | H01L 21/823462 257/E21.625 |
| 7,078,354 | B2 * | 7/2006 | Kanda | H01L 21/823462 257/632 |
| 7,563,726 | B2 * | 7/2009 | Cho | H01L 27/10894 438/769 |
| 7,829,447 | B2 * | 11/2010 | Mathew | H01L 29/66795 438/551 |
| 7,968,441 | B2 * | 6/2011 | Xu | H01L 21/324 438/530 |
| 8,460,996 | B2 * | 6/2013 | Karve | H01L 21/823857 438/254 |
| 9,142,566 | B2 * | 9/2015 | Hong | H01L 27/1203 |
| 9,218,978 | B1 * | 12/2015 | Ramkumar | H01L 29/792 |
| 9,257,554 | B2 * | 2/2016 | Shum | G11C 16/00 |
| 9,466,480 | B2 * | 10/2016 | Guo | H01L 21/02181 |
| 9,824,895 | B1 * | 11/2017 | Ramkumar | H01L 21/76202 |
| 9,875,900 | B2 * | 1/2018 | Hee | H01L 27/11517 |
| 10,622,449 | B2 * | 4/2020 | Hee | H01L 29/788 |
| 2002/0028554 | A1 * | 3/2002 | Bronner | H01L 21/823462 438/275 |
| 2002/0197784 | A1 * | 12/2002 | Luoh | H01L 21/28211 438/211 |
| 2003/0008526 | A1 * | 1/2003 | Gambino | H01L 21/0223 438/787 |
| 2006/0051903 | A1 * | 3/2006 | Kunii | H01L 27/12 438/142 |
| 2007/0122981 | A1 * | 5/2007 | Park | H01L 21/823462 438/275 |
| 2015/0069524 | A1 | 3/2015 | Hong et al. | |
| 2015/0108559 | A1 * | 4/2015 | Hee | H01L 27/11517 257/315 |
| 2015/0243523 | A1 * | 8/2015 | Li | H01L 21/823842 438/585 |
| 2017/0062266 | A1 * | 3/2017 | Deng | H01L 21/76224 |

FOREIGN PATENT DOCUMENTS

| | | |
|---|---|---|
| CN | 101123252 | 2/2008 |
| CN | 104952734 | 9/2015 |
| CN | 105184356 | 12/2015 |

\* cited by examiner

METHOD TO IMPROVE CMOS DEVICE PERFORMANCE

CROSS-REFERENCES TO RELATED APPLICATIONS

The present application claims priority to Chinese patent application No. 201710171545.2, filed with the State Intellectual Property Office of People's Republic of China on Mar. 22, 2017, the content of which is incorporated herein by reference in its entirety.

FIELD OF THE INVENTION

The present disclosure relates to semiconductor technology, and more particularly to a semiconductor device having an improved gate oxide and manufacturing method of the same.

BACKGROUND OF THE INVENTION

In the manufacturing process of integrated circuits, it may be desirable to simultaneously manufacture different types of devices, for example, input/output (I/O) devices and core devices are required to be manufactured concurrently.

With the decrease in the device feature size, a gate oxide formed by a conventional furnace oxidation and other similar processes has poor quality and reliability due to the problem of leakage, therefore, the formed gate oxide can no longer satisfy the device requirements. An oxide formed by using an in-situ steam generation (ISSG) process has a higher reliability relative to a conventional gate oxide and can thus replace the conventional gate oxide.

Other problems may also exist, however, with the ISSG process that may affect the performance and reliability of a semiconductor device when two different types of devices are manufactured concurrently.

BRIEF SUMMARY OF THE INVENTION

The present inventors have discovered that, when a gate oxide layer of an I/O device and a gate oxide layer of a core device are fabricated concurrently, the gate oxide formed by the in-situ steam generation (ISSG) process has the following problems: when a photolithography process is required to remove the gate oxide on the core device region, the gate oxide of the core region may reacts with the photoresist that is formed thereon to generate a layer that cannot be removed easily. This layer that is not easily removed may affect the gate oxide performance in the I/O device region and degrade the gate oxide reliability of the I/O device region. The present inventors thus disclose a novel gate oxide structure and manufacturing method of the same to provide a gate oxide layer having higher quality and reliability.

According to one aspect of the present invention, a method for manufacturing a semiconductor device may include providing a substrate including a first device region and a second device region spaced apart from each other, forming a first oxide layer on the first device region and the second device region, forming a second oxide layer below the first oxide layer, forming a mask layer on the first oxide layer on the first device region while exposing the first oxide layer on the second device region, removing the first and second oxide layers on the second device region using the mask layer as a mask, removing the mask layer, and forming a gate oxide layer on the second device region.

In one embodiment, the method may further include, prior to forming the mask layer, forming a third oxide layer below the second oxide layer, and removing the first and second oxide layers on the second device region includes removing the third oxide layer on the second device region. The first, second, and third oxide layers together form a gate oxide layer for the first device region.

In one embodiment, forming the first oxide layer and forming the third oxide layer each include a furnace oxidation process. In one embodiment, the furnace oxidation process is performed at a temperature in a range between 700 degrees Celsius and 1000 degrees Celsius, a pressure in a range between 0.5 torr and 760 torr, a reaction gas that can be $O_2$, a gas mixture of $O_2$ and $H_2$, or a gas mixture of $O_2$ and $N_2$, and for a period of time in a range between 5 minutes and 2 hours. In one embodiment, the formed oxide layer is free of —OH bonds to prevent any reaction with the mask layer.

In one embodiment, the third oxide layer has a thickness in a range between 5 angstroms and 50 angstroms.

In one embodiment, the method further includes, prior to forming the mask layer, forming a fourth oxide layer on the first oxide layer; and removing the first and second oxide layers on the second device region includes removing the fourth oxide layer on the second device region. The first, second, and fourth oxide layers collectively form a gate oxide layer for the first device region.

In one embodiment, forming the first oxide layer includes a furnace oxidation process, and forming the second oxide layer includes an in-situ steam generation process.

In one embodiment, the in-situ steam generation process is performed at a temperature in a range between 700 degrees Celsius and 1100 degrees Celsius, a pressure in a range between 0.5 torr and 20 torr, a reaction gas that is a gas mixture of $O_2$ and $H_2$, or a gas mixture of $N_2O$ and $H_2$, and for a period of time in a range between 8 seconds and 120 seconds.

In one embodiment, the method may also include, prior to forming the first oxide layer, performing a cleaning process on the first and second device regions.

In one embodiment, the first oxide layer has a thickness in a range between 5 angstroms and 50 angstroms; and the second oxide layer has a thickness in a range between 5 angstroms and 100 angstroms.

In one embodiment, the first device region is an input/output device region, and the second device region is a core device region.

In one embodiment, the gate oxide layer on the second device region has a thickness that is smaller than a sum of thicknesses of the first and second oxide layers on the first device region.

Embodiments of the present invention also provide a semiconductor device. The semiconductor device includes a substrate including a first device region and a second device region spaced apart from each other, a gate oxide layer on the first device region including a second oxide layer on the first device region and a first oxide layer on the second oxide layer, and a gate oxide layer on the second device region.

In one embodiment, the gate oxide layer on the first device region further includes a third oxide layer disposed below the second oxide layer. In one embodiment, the third oxide layer has a thickness in a range between 5 angstroms and 50 angstroms.

In one embodiment, the gate oxide layer on the first device region further comprises a fourth oxide layer on the first oxide layer.

In one embodiment, the first oxide layer is free of —OH bonds and has a thickness in a range between 5 angstroms and 50 angstroms; and the second oxide layer has a thickness in a range between 5 angstroms and 100 angstroms.

In one embodiment, the first device region is an input/output device region, and the second device region is a core device region. In one embodiment, the gate oxide layer on the second device region has a thickness that is smaller than a sum of thicknesses of the first and second oxide layers on the first device region.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Figure 1:
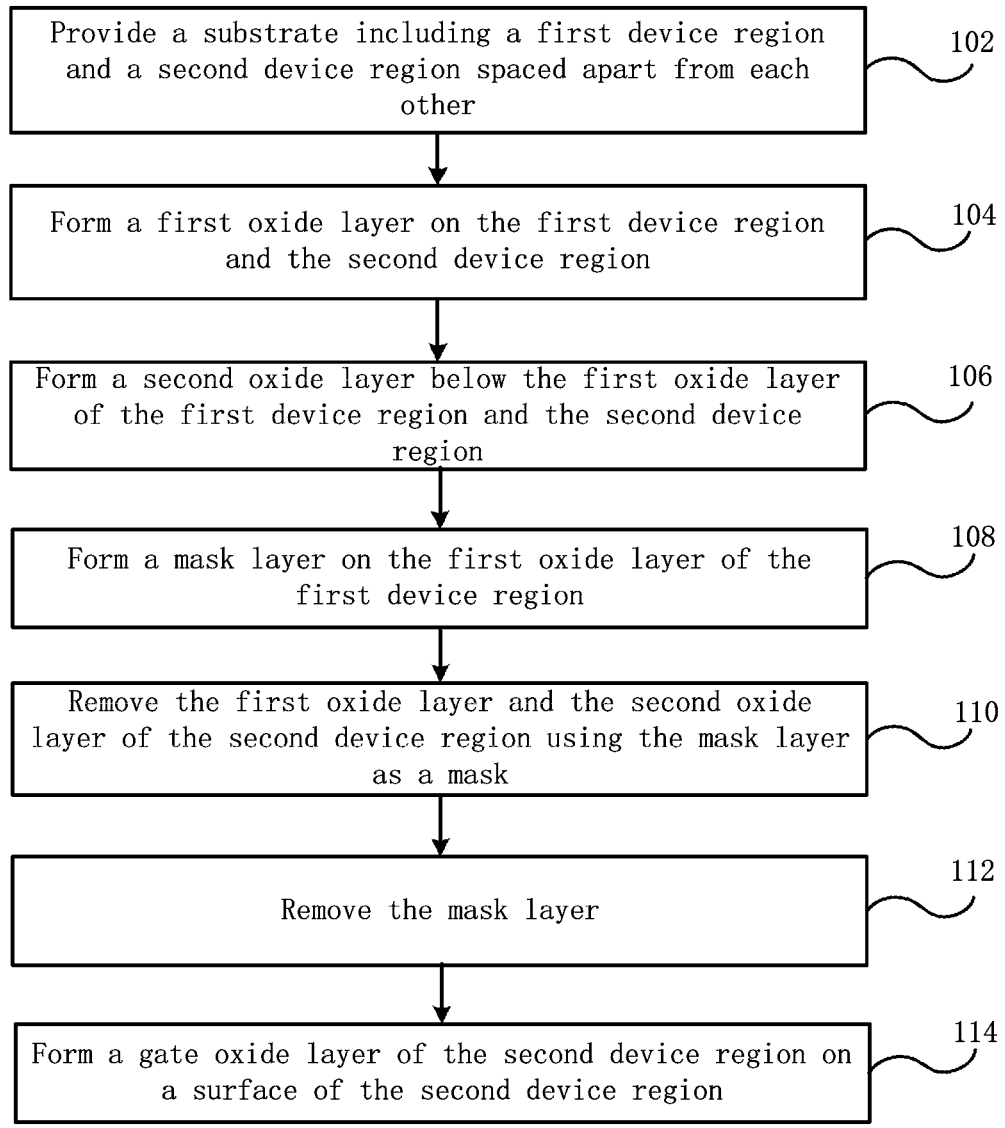
FIG. 1 is a simplified flowchart illustrating a method of manufacturing a semiconductor device according to an embodiment of the present invention.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and the are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The embodiments described and references in the disclosure to "one embodiment," "an embodiment," "an exemplary embodiment" indicate that the embodiments described may include a particular feature, structure, or characteristic. However, every embodiment may not necessary include the particular feature, structure or characteristic. As used throughout this disclosure, the terms "depositing" and "forming" are used interchangeably.

Embodiments of the present invention now will be described more fully hereinafter with reference to the accompanying drawings, in which embodiments of the invention are shown. This invention may, however, be embodied in many different forms and should not be construed as limited to the embodiments set forth herein.

FIG. 1 is a simplified flowchart illustrating a method of manufacturing a semiconductor device according to an embodiment of the present invention. FIGS. 2A to 2F are cross-sectional views illustrating intermediate stages of a semiconductor device in the manufacturing method according to an embodiment of the present invention.

A manufacturing method of a semiconductor device according to an embodiment of the present invention will be described in detail with reference to FIG. 1 and FIGS. 2A to 2F.

Referring to FIG. 1, a substrate is provided at 102.

Figure 2A:
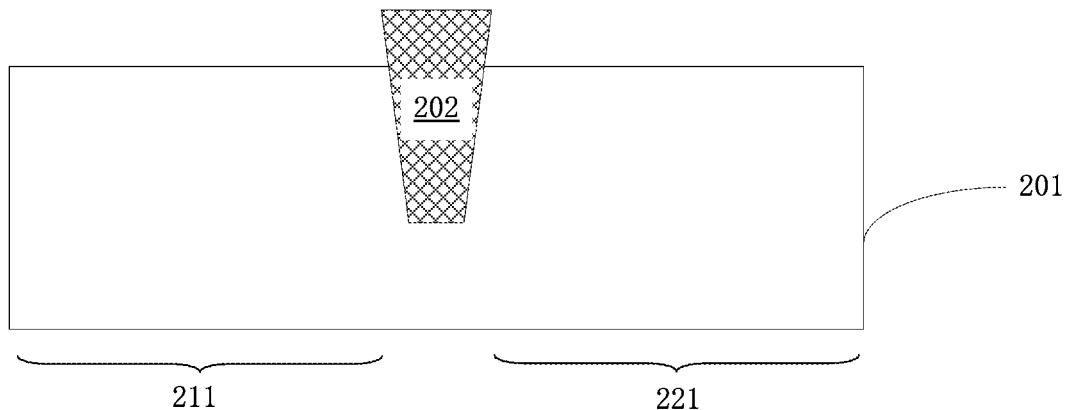
FIGS. 2A to 2F are cross-sectional views illustrating intermediate stages of a semiconductor device in the manufacturing method according to an embodiment of the present invention.

FIG. 2A is a cross-sectional view illustrating a substrate 201 in the manufacturing method according to an embodiment of the present invention. Referring to FIG. 2A, substrate 201 includes a first device region 211 and a second device region 221 that are spaced apart from each other. In one embodiment, first device region 211 and second device region 221 may be isolated by an isolation structure (e.g., a shallow trench isolation structure) 202. In one embodiment, first device region 211 may be an I/O device region, and second device region 221 may be a core device region. However, the present invention is not limited thereto.

Figure 2B:
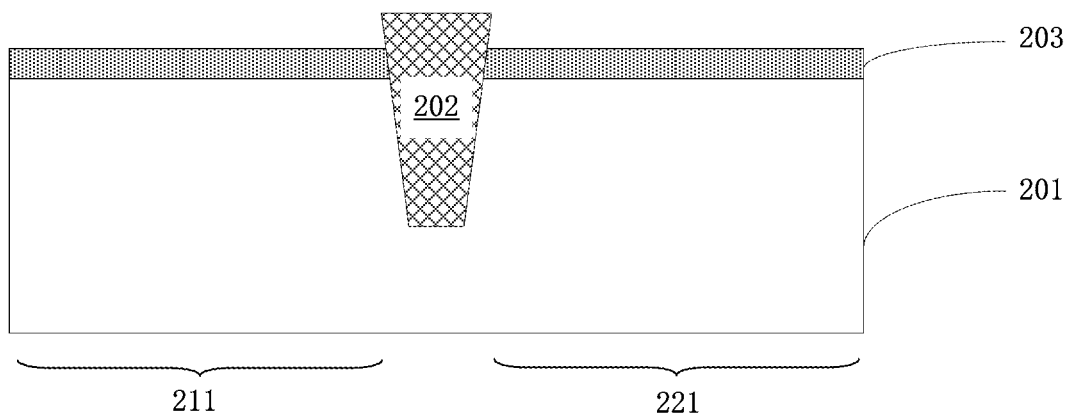

Next, at 104, a first oxide layer 203 is formed on the surface of first device region 211 and second device region 221, as shown in FIG. 2B. In one embodiment, prior to forming first oxide layer 211, a cleaning process may be performed on first device region 211 and second device region 221 to remove an oxide layer inherent to the surface of first device region 211 and second device region 221.

In one embodiment, first oxide layer 203 may be formed using a furnace oxidation or a rapid thermal oxidation (RTO) process. In another embodiment, first oxide layer 203 may be formed using a chemical vapor deposition (CVD) or an atomic layer deposition (ALD) process. In one embodiment, first oxide layer 203 has a thickness in the range between 5 angstroms and 50 angstroms, e.g., 10 angstroms, 20 angstroms, or 40 angstroms.

In one embodiment, the furnace oxidation for forming first oxide layer 203 may be performed at a temperature in the range between 700 degrees Celsius and 1000 degrees Celsius (e.g., 800° C., 900° C., etc.), at a pressure in the range between 0.5 torr and 760 torr (e.g., 50 torr, 100 torr, 300 torr, 500 torr), with a reaction gas containing $O_2$, or a reaction gas that is a gas mixture containing $O_2$ and $H_2$, or a reaction gas of a gas mixture containing $O_2$ and Na, and for a time duration between 5 minutes and 2 hours (e.g., 30 minutes, 1 hour).

Figure 2C:
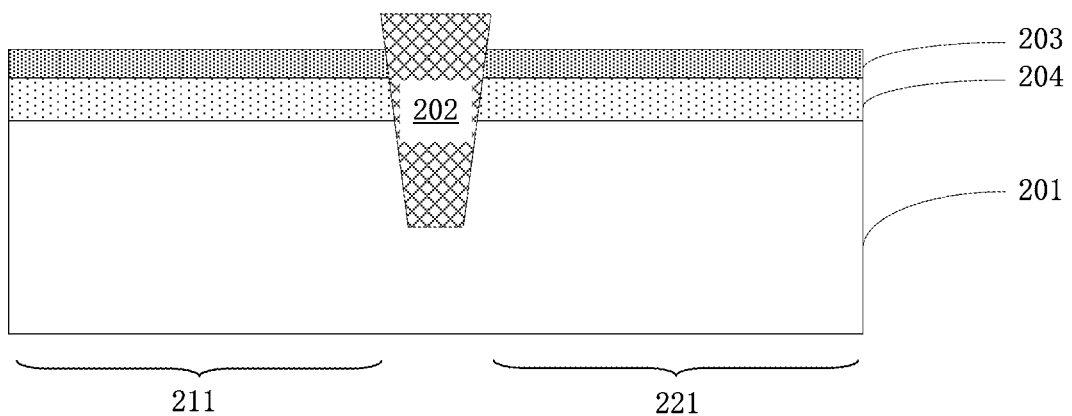

Next, at 106, a second oxide layer 204 is formed in first device region 211 and second device region 221 below first oxide layer 203, as shown in FIG. 2C.

In one embodiment, second oxide layer 204 is formed using an in-situ steam generation (ISSG) process. In one embodiment, the ISSG process may be performed at a temperature in the range between 700 degrees Celsius and 1100 degrees Celsius (e.g., 800° C., 900° C., etc.), at a pressure in the range between 0.5 torr and 20 torr (e.g., 5 torr, 10 torr, 15 torr, etc.), with a reaction gas of a gas mixture containing $O_2$ and $H_2$, or a reaction gas of a gas mixture containing $N_2O$ and $H_2$, for a time duration between 8 seconds and 120 second (e.g., 20 seconds, 50 seconds, 80 seconds). In one embodiment, second oxide layer 204 has a thickness that is greater than the thickness of first oxide layer, e.g., the thickness of second oxide layer 204 may be in the range between 5 angstroms and 100 angstroms, e.g., 10 angstroms, 30 angstroms, 40 angstroms, 50 angstroms, 60 angstroms, or 80 angstroms.

Figure 2D:
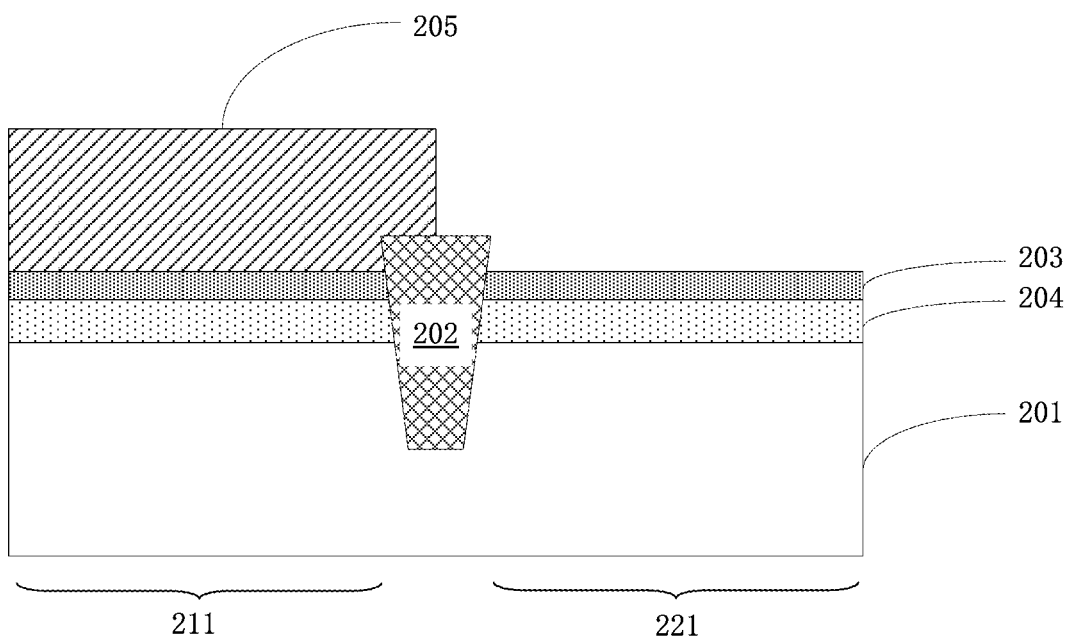

Next, at 108, a mask layer (e.g., a photoresist) 205 is formed on first oxide layer 203 of first device region 203, as shown in FIG. 2D.

Figure 2E:
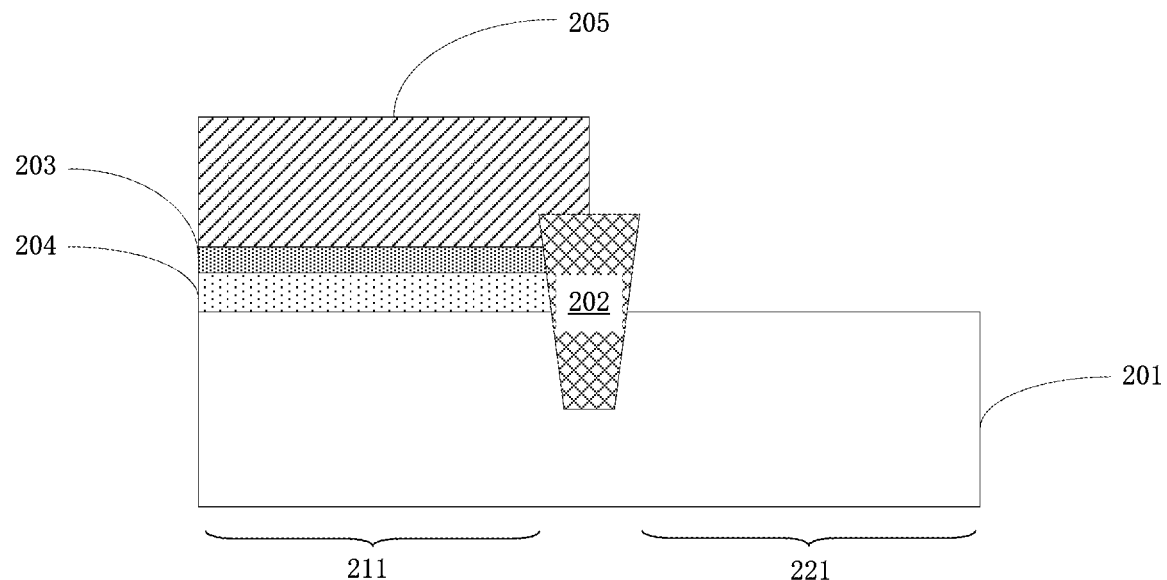

Next, at 110, first oxide layer 203 and second oxide layer 204 of second device region 221 are removed using mask layer 205 as a mask, as shown in FIG. 2E. In the embodiment, first oxide layer 203 and second oxide layer 204 of first device region 211 serve as a gate oxide for first device region 211.

Figure 2F:
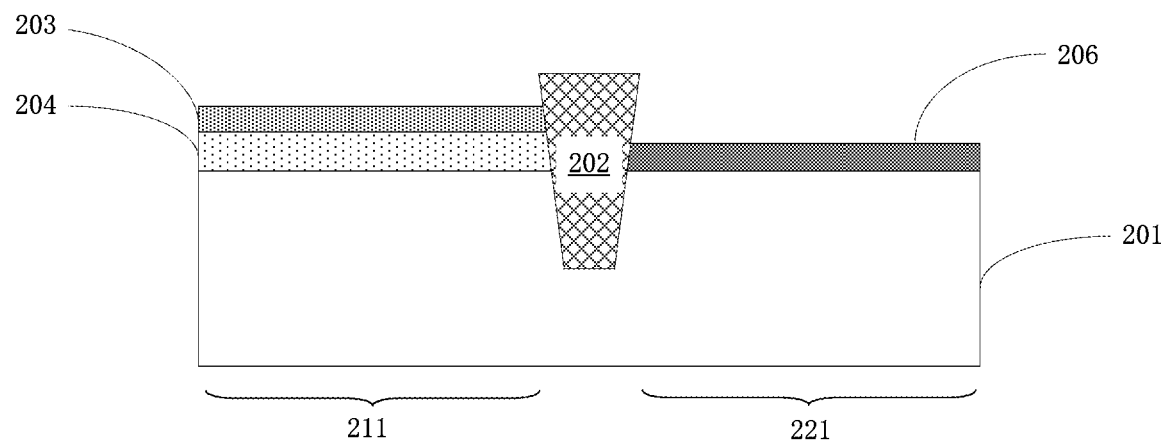

Next, at 112, mask layer 205 is removed, as shown in FIG. 2F.

Next, at 114, referring to FIG. 2F, a gate oxide layer 206 for second device region 221 is formed on the surface of second device region 221. In one embodiment, gate oxide layer 206 has a thickness that is less than the thickness of the gate oxide layer of first device region 211 (the thickness of gate oxide layer of first device region 211 is the sum of thicknesses of first oxide layer 203 and second oxide layer 204). For example, the thickness of the gate oxide layer for the core device region is smaller than the thickness of the gate oxide layer for the I/O device region.

A method of manufacturing a semiconductor device according to an embodiment of the present invention is described in the sections above. In the embodiment, a first oxide layer is formed on the second oxide layer as a protection layer. The first oxide layer does not react with the mask layer, thereby preventing the mask layer from reacting with the second oxide layer to form a layer that is not easily removed and improving the reliability of the gate oxide layer.

In the case where first oxide layer 203 is formed by a furnace oxidation process and second oxide layer 204 is formed by an in-situ steam generation process, the present inventors discovered that, if a photoresist is formed directly on second oxide layer 204, the —OH bond in second oxide layer 204 reacts with the photoresist, and if first oxide layer 203 is formed by a furnace oxidation process, first oxide layer 203 does not contains the —OH bond, so that the first oxide layer does not react with the photoresist.

FIGS. 3A to 3G are cross-sectional views illustrating intermediate stages of a semiconductor device in the manufacturing method according to another embodiment of the present invention. Compared to the embodiment shown in FIGS. 2A-2F, the embodiment of FIGS. 3A-3G further includes forming a third oxide layer below the second oxide layer. The following description only focuses on the differences between the embodiment of FIGS. 3A-3G and the embodiment of FIGS. 2A-2F. Components having similar or same reference numerals may be referred to the above-described sections.

Figure 3A:
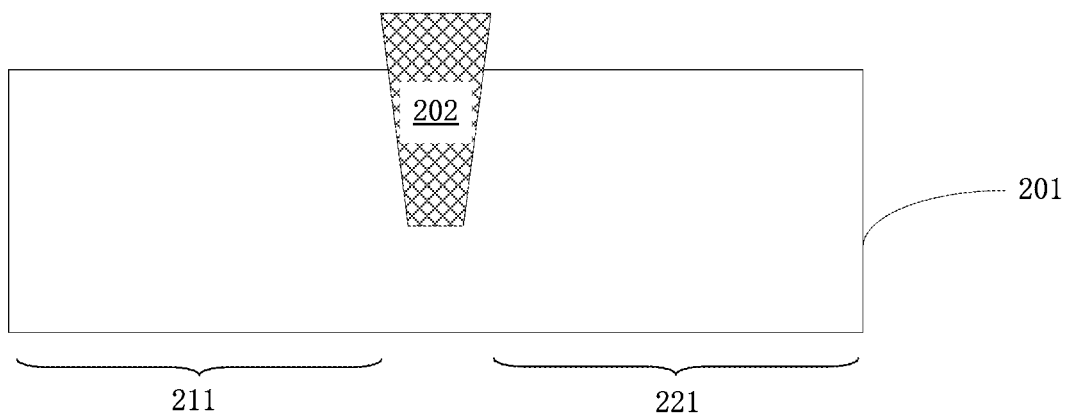
FIGS. 3A to 3G are cross-sectional views illustrating intermediate stages of a semiconductor device in the manufacturing method according to another embodiment of the present invention.

Referring to FIG. 3A, a substrate 201 is provided. Substrate 201 includes a first device region 211 and a second device region 221 that are spaced apart and isolated from each other.

Figure 3B:
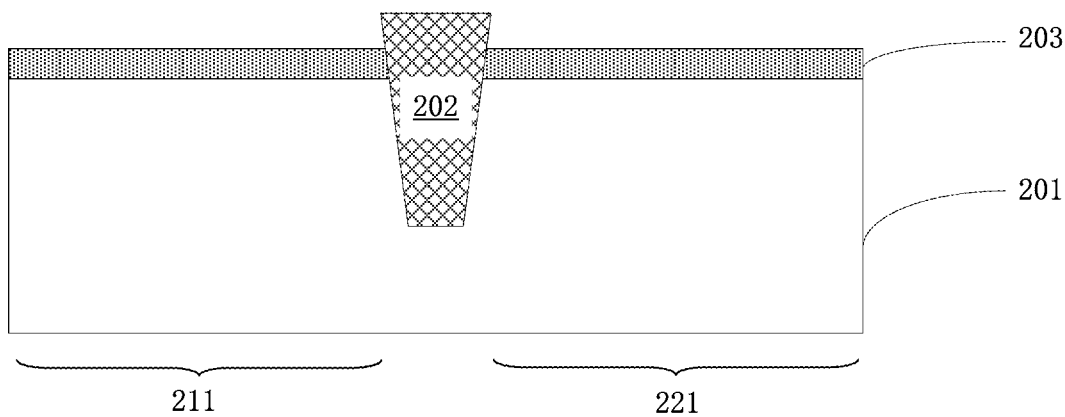

Referring to FIG. 3B, a first oxide layer 203 is formed on the surface of first device region 211 and second device region 221.

Figure 3C:
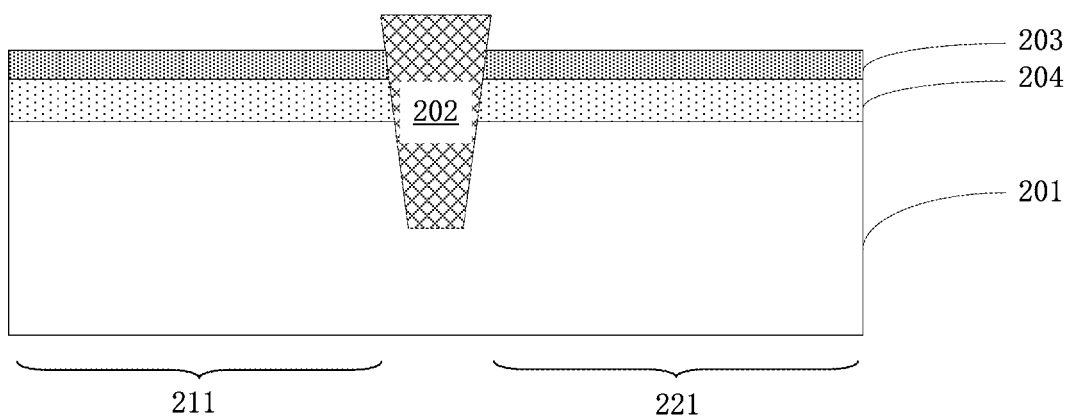

Referring to FIG. 3C, a second oxide layer 204 is formed in first device region 211 and second device region 221 below first oxide layer 203.

Figure 3D:
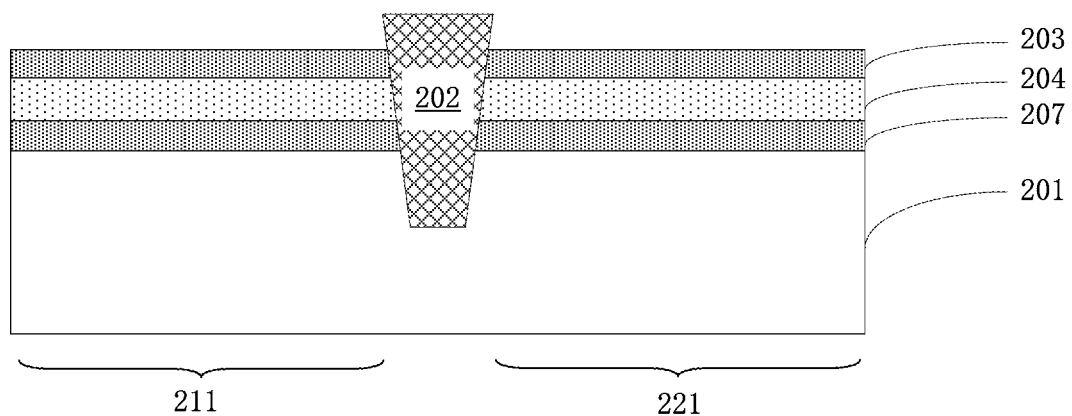

Referring to FIG. 3D, a third oxide layer 207 is formed in first device region 211 and second device region 221 below second oxide layer 204.

In one embodiment, third oxide layer 207 is formed using a furnace oxidation process. In one embodiment, the furnace oxidation process may be performed at a temperature in the range between 700 degrees Celsius and 1000 degrees Celsius (e.g., 800° C., 900° C., etc.), at a pressure in the range between 0.5 torr and 760 torr (e.g., 50 torr, 100 torr, 300 torr, 500 torr), with a reaction gas containing $O_2$, or a reaction gas of a gas mixture containing $O_2$ and $H_2$, or a reaction gas of a gas mixture containing $O_2$ and Na, and for a time duration between 5 minutes and 2 hours (e.g., 30 minutes, 1 hour, etc.).

In one embodiment, third oxide layer 207 has a thickness in the range between 5 angstroms and 50 angstroms, e.g., 10 angstroms, 20 angstroms, 40 angstroms.

Figure 3E:
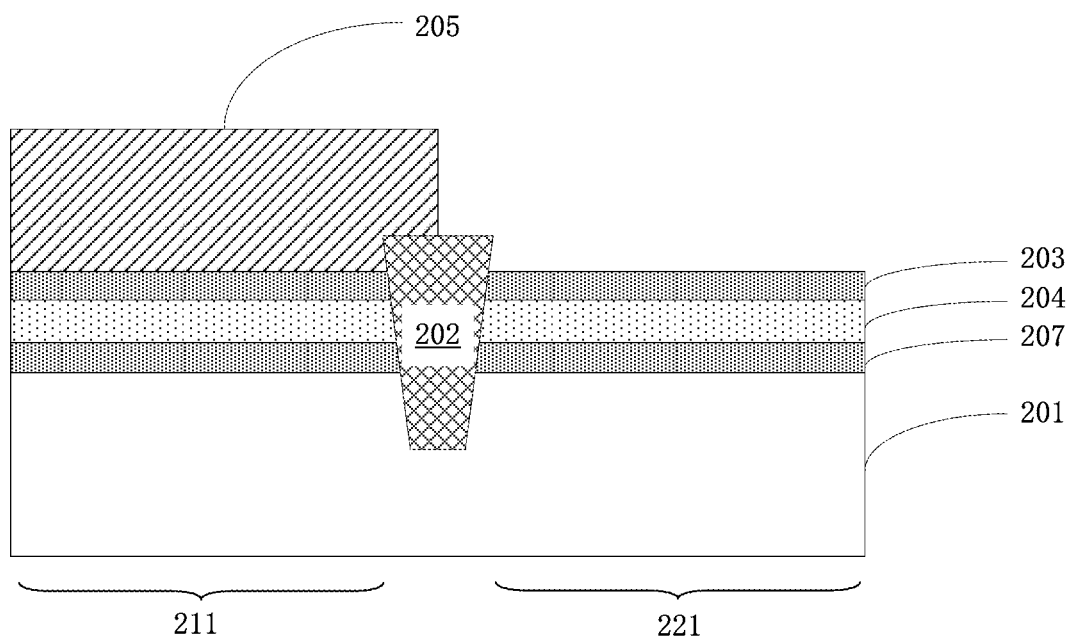

Referring to FIG. 3E, a mask layer (e.g., a photoresist) 205 is formed on first oxide layer 203 of first device region.

Figure 3F:
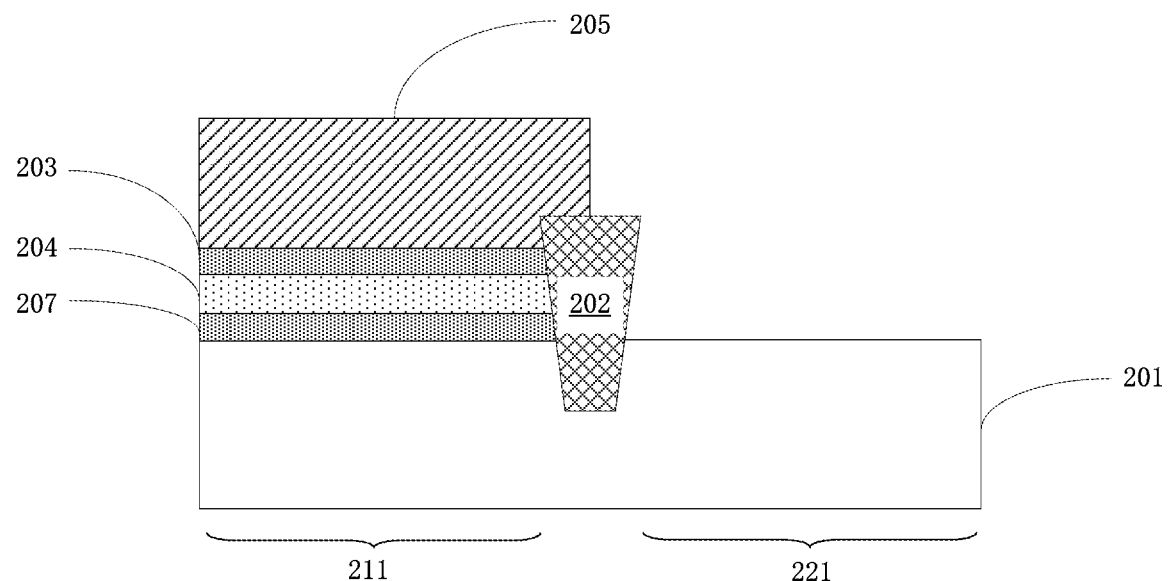

Referring to FIG. 3F, first oxide layer 203, second oxide layer 204, and third oxide layer 207 of second device region 221 are removed using mask layer 205 as a mask. In the embodiment, first oxide layer 203, second oxide layer 204, and third oxide layer 207 of first device region 211 serve as a gate oxide for first device region 211.

Figure 3G:
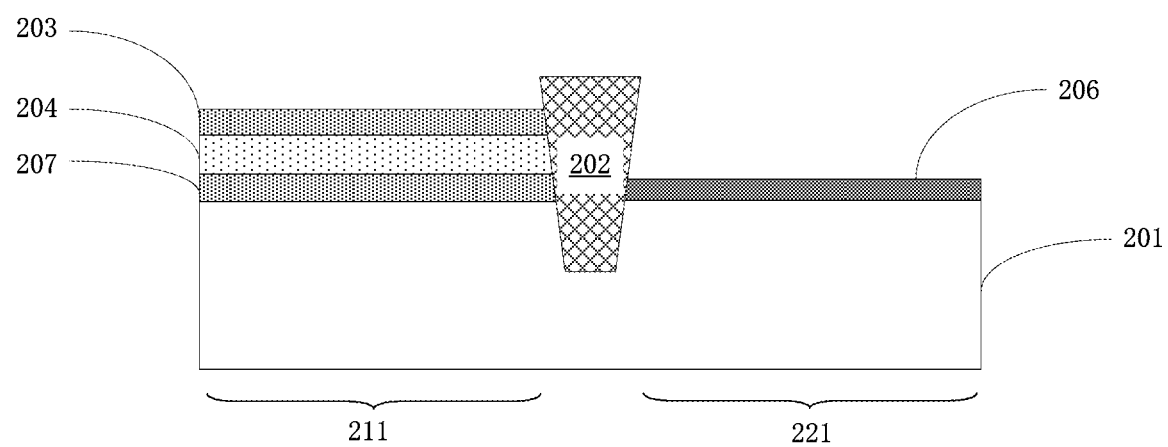

Referring to FIG. 3G, mask layer 305 is removed. A gate oxide layer 206 for second device region 221 is formed on the surface of second device region 221.

In this embodiment, a sandwich structure including first oxide layer 203, second oxide layer 204, and third oxide layer 207 is formed. Second oxide layer 204 is mainly used for preventing leakage, first oxide layer 203 is used for preventing second oxide layer 203 from reacting with mask layer 205, and third oxide layer 207 is used for improving the interface properties second oxide layer 204 and substrate 211, e.g., for reducing the hydrogen content of the interface. The embodiment can further improve the reliability of the gate oxide layer.

In other embodiments, a fourth oxide layer may also be formed on first device region 211 and second device region 221 to further prevent second oxide layer 204 from reacting with mask layer 205, thereby improving the gate oxide layer quality and reliability.

Embodiments of the present invention also provide different semiconductor devices based on the above-described manufacturing methods.

In one embodiment, referring to FIG. 2F, a semiconductor device includes a substrate 201, a first device region (e.g., I/O device region) 211, and a second device region (e.g., core device region) 221 in substrate 201. The first and second device regions are spaced apart and isolated from each other. The semiconductor device further includes a gate oxide layer for first device region 211 disposed on the surface of first device region 211. The gate oxide layer includes a second oxide layer 204 on the surface of first device region, a first oxide layer 203 on second oxide layer 204. The semiconductor device also includes a gate oxide layer 206 for second device region 221 disposed on the surface of second device region 221. In one embodiment, gate oxide layer 206 for second device region 221 has a thickness smaller than the thickness of the gate oxide layer for first oxide region 211.

In another embodiment, referring to FIG. 3G, the gate oxide layer for first device region 211 further includes a third oxide layer 207 disposed on the surface of first device region 211 below second oxide layer 204.

In one embodiment, the gate oxide layer for first device region 211 further includes a fourth oxide layer (not shown) on first oxide layer 203, the fourth oxide layer is used to prevent second oxide layer 204 from reacting with mask layer 205, thereby improving the gate oxide layer quality and reliability.

In one embodiment, first oxide layer is formed using a furnace oxidation process and has a thickness in the range between 5 angstroms and 50 angstroms, second oxide layer 204 is formed by an in-situ steam generation (ISSG) process and has a thickness in the range between 5 angstroms and 100 angstroms. In one embodiment, third oxide layer 207 is formed using a furnace tube oxidation process and has a thickness in the range between 5 angstroms and 50 angstroms. The first oxide layer is free of —OH bonds and used as a protection layer to prevent the second oxide layer from reacting with the mask layer that is used as an etch mask for removing the first, second, and third oxide layers on second device region 221, as shown in FIG. 3F.

The foregoing descriptions of specific embodiments of the present invention have been presented for purpose of illustration and description. They are not intended to be exhaustive or to limit the invention to the precise forms disclosed, and obviously many modifications and variations are possible in light of the above disclosure. The exemplary embodiment has been described in order to best explain the principles of the invention and its practical application. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A semiconductor device, comprising:
   a substrate including a first device region, a second device region spaced apart from each other, and an isolation structure between the first device region and the second device region;
   a gate oxide layer on the first device region including a second oxide layer on the first device region and a first oxide layer on the second oxide layer; and
   a gate oxide layer on the second device region,
   wherein the first oxide layer is free of —OH bonds and has a thickness in a range between 5 angstroms and 50 angstroms,
   the gate oxide layer on the first device region is physically isolated from the gate oxide layer on the second device region by the isolation structure,
   the second oxide layer has a thickness in a range between 5 angstroms and 100 angstroms, and
   the thickness of the second oxide layer is greater than the thickness of the first oxide layer.

2. The semiconductor device of claim 1, wherein the gate oxide layer on the first device region further comprises a third oxide layer disposed below the second oxide layer.

3. The semiconductor device of claim 2, wherein the third oxide layer has a thickness in a range between 5 angstroms and 50 angstroms.

4. The semiconductor device of claim 2, wherein the gate oxide layer on the first device region further comprises a fourth oxide layer on the first oxide layer.

5. The semiconductor device of claim 1, wherein the first device region is an input/output device region, and the second device region is a core device region.

6. The semiconductor device of claim 1, wherein the gate oxide layer on the second device region has a thickness that is smaller than a sum of thicknesses of the first and second oxide layers on the first device region.

7. The semiconductor device of claim 1, wherein a top surface of the isolation structure is higher than a top surface of the first oxide layer.

8. A semiconductor device, comprising:
   a substrate including a first device region, a second device region spaced apart from each other, and an isolation structure between the first device region and the second device region;
   a first gate oxide layer on the first device region comprising a second oxide layer on the first device region and a first oxide layer on the second oxide layer; and
   a second gate oxide layer on the second device region,
   wherein the first gate oxide layer on the first device region further comprises a third oxide layer disposed below the second oxide layer, the third oxide layer having a thickness in a range between 5 angstroms and 50 angstroms,
   the first gate oxide on the first device region is physically isolated from the first gate oxide on the second device region by the isolation structure,
   the thickness of the second oxide layer is greater than the thickness of the first oxide layer the first oxide layer is free of —OH bonds and has a thickness in a range between 5 angstroms and 50 angstroms; and the second oxide layer has a thickness in a range between 5 angstroms and 100 angstroms.

9. The semiconductor device of claim 8, wherein the first gate oxide layer on the first device region further comprises a fourth oxide layer on the first oxide layer.

10. The semiconductor device of claim 8, wherein the first device region is an input/output device region, and the second device region is a core device region.

11. The semiconductor device of claim 8, wherein the second gate oxide layer on the second device region has a thickness that is smaller than a sum of thicknesses of the first and second oxide layers on the first device region.

\* \* \* \* \*